United States Patent [19]
Pidgeon et al.

[11] Patent Number: 4,683,348
[45] Date of Patent: Jul. 28, 1987

[54] SOLAR CELL ARRAYS

[75] Inventors: Alastair N. Pidgeon, Turin, Italy; Arthur L. Webb, Guildford, England

[73] Assignee: The Marconi Company Limited, England

[21] Appl. No.: 855,513

[22] Filed: Apr. 23, 1986

[30] Foreign Application Priority Data

Apr. 26, 1985 [GB] United Kingdom ............... 8510706

[51] Int. Cl.⁴ .......................................... H01L 25/02
[52] U.S. Cl. ................................................ 136/246
[58] Field of Search ......................................... 136/246

[56] References Cited

PUBLICATIONS

R. E. Patterson et al., *Conf. Record, 16th IEEE Photovoltaic Specialists Conf.* (1982), published Jan. 1983, pp. 39–44.

E. L. Ralph, *Conf. Record, IEEE Photovoltaic Specialists Conf.* (1970), pp. 326–330.

W. D. Ebeling et al., *Proceedings Int'l Photovoltaic Solar Energy Conf.* (1977), Reidel Publishing Co. (1978), pp. 1056–1070.

*Primary Examiner*—Aaron Weisstuch
*Attorney, Agent, or Firm*—Kirschstein, Kirschstein, Ottinger & Israel

[57] ABSTRACT

A solar cell array comprises a common member (13) on which solar cells (4) of a plurality of solar cell units are mounted, the primary reflectors (2) of the cell units being formed on shaped portions of a first unitary member (7) and the secondary reflectors (3) on shaped portions of a second unitary member (8). The common member (13) serves to conduct heat away from the cells.

6 Claims, 7 Drawing Figures

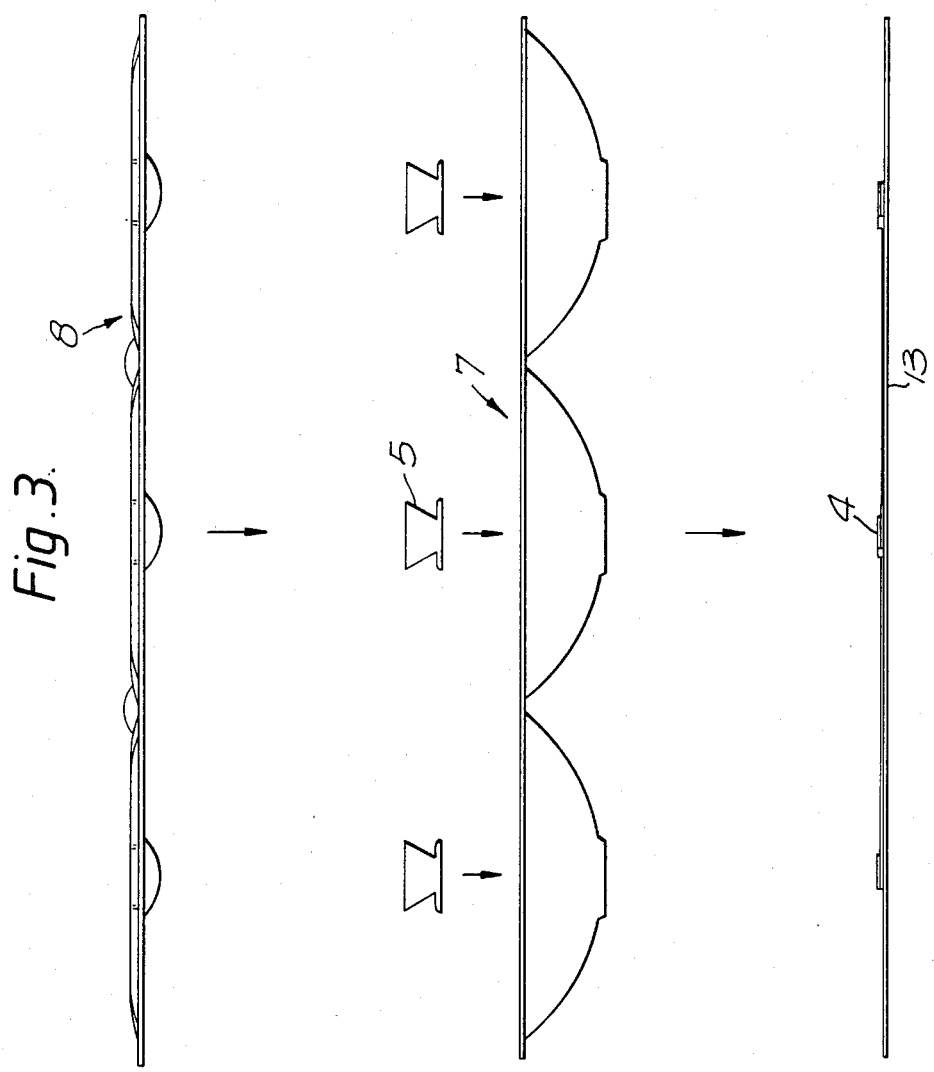

SOLAR CELL ARRAYS

BACKGROUND OF THE INVENTION

1. Field of the Invention

This invention relates to solar cell arrays.

2. Description of Related Art

It is known to make use of a cassegrain optical system for concentrating sunlight on to a solar cell, the sunlight being reflected by a concave primary reflector to a convex secondary reflector which in turn reflects the light back to the solar cell which is usually located close to the primary reflector.

SUMMARY OF THE INVENTION

One object of the present invention is to provide a novel construction of an array of solar cells which utilise the cassegrain principle and which facilitates manufacture.

According to the present invention there is provided a solar cell array comprising a multiplicity of cell units each comprising a concave primary reflector for reflecting sunlight onto a convex secondary reflector which in turn reflects light onto a solar cell, and characterised in that the solar cells of all the cell units are mounted on a common member which serves to conduct heat away from the cells, the primary reflectors of all said cell units are formed on shaped portions of a first unitary member, and the secondary reflectors are formed on shaped portions of a second unitary member, each shaped portion of the second unitary member being connected to adjacent shaped portions by rigid arms to provide an open framework.

Preferably the array has at least nine of said units which are arranged in at least three rows each containing three or more units.

BRIEF DESCRIPTION OF THE DRAWINGS

One construction of solar cell array in accordance with the invention and its manufacture will now be described with reference to the three figures of the accompanying drawings in which:

FIG. 3 shows an exploded view of part of the array.

DETAILED DESCRIPTION OF THE PREFERRED EMBODIMENTS

The array now to be described is suitable for use on a satellite and other space craft and comprises a multiplicity of solar cell units, for example four hundred, to form a single rigid panel.

Figure 1:
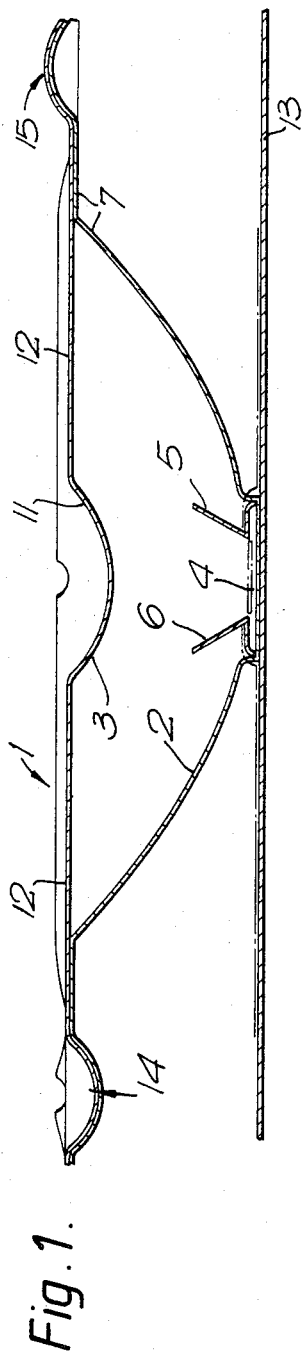
FIG. 1 shows a cross-section through part of the array.

Referring to FIG. 1 which shows one such unit, the panel is pointed during use so that the aperture 1 (not strictly in the plane of FIG. 1 as will subsequently be apparent) is facing the sun within a small angle. Sunlight enters the aperture 1 and is reflected by a primary reflector 2 of paraboloidal shape on to a secondary reflector 3 of hyperboloidal shape and thence on to a solar cell 4. A light catcher cone 5 having a reflecting surface 6 permits some tolerance in the angle at which the panel is pointed towards the sun.

Figure 2:
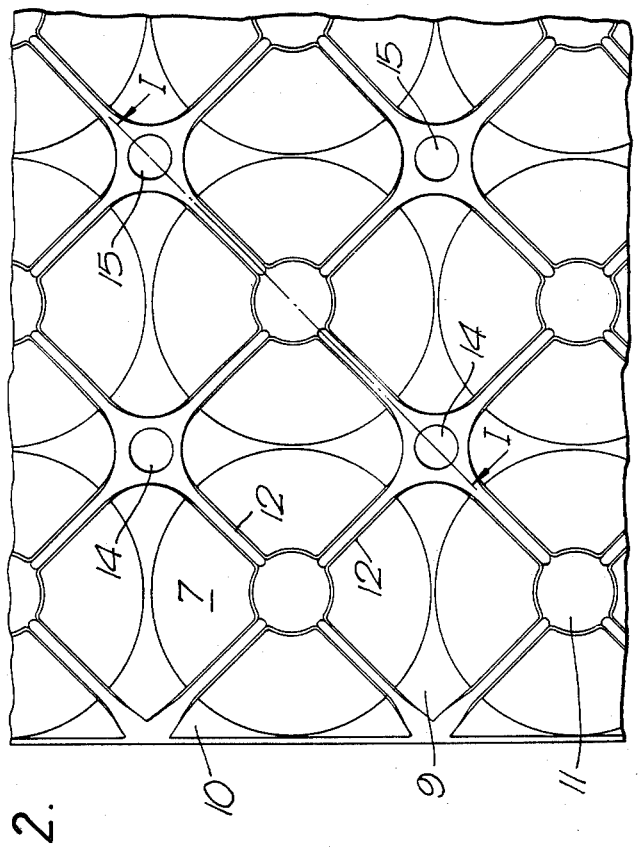
FIG. 2 shows a plan view of a larger part of the array, FIG. 1 being a cross-section at the line I—I in FIG. 2.
Figure 4A:
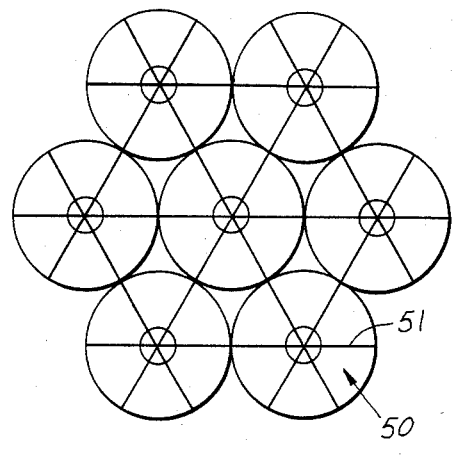
FIGS. 4a, 4b, 4c and 4d show in plan view four different ways in which the cells of the solar cell array can be packed.
Figure 4B:
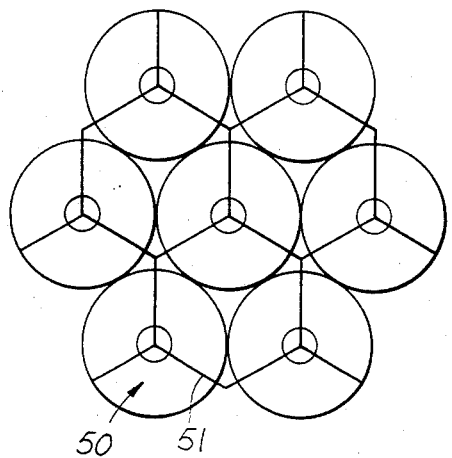
Figure 4C:
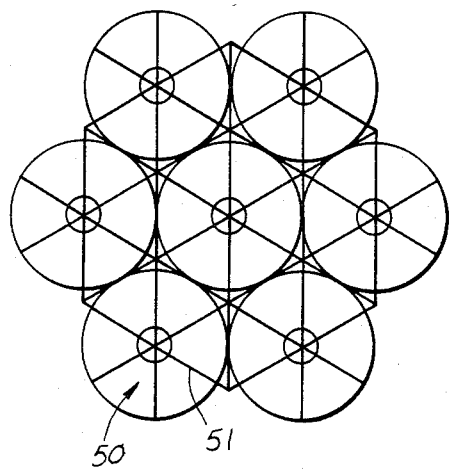
Figure 4D:
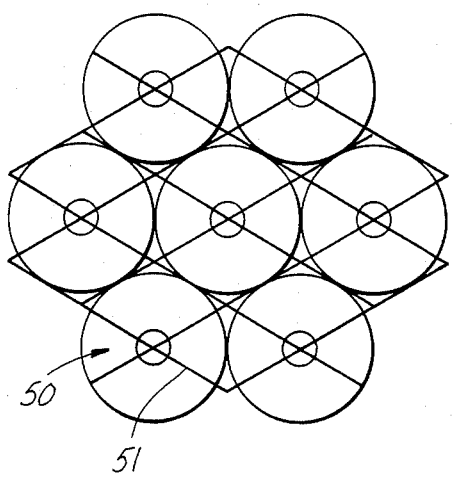

Referring now also to FIGS. 2 and 3, the primary reflectors 2 of all the units of the array are moulded from a sheet 7 of carbon-fiber composite, the required reflecting surfaces being formed on the appropriate parts of the sheet for example by vapor deposition.

Similarly the secondary reflectors 3 of all the units are moulded from a sheet 8 of carbon-fiber composite after areas, such as those marked 9 and 10 in the drawing, have been removed to leave reflector portions 11 interconnected by rigid arms 12. The arms 12 have a generally U-shaped cross-section so as to impart stiffness. The required reflecting surfaces of the portions 11 are again formed by vapour deposition.

A rigid member 13 having high thermal conductivity has the solar cell 4, which may conveniently be a gallium arsenide cell, of each unit mounted thereon with suitable electrical connections (not shown) to all the cells. The member 13 serves to conduct heat away from the solar cells, thereby improving the efficiency of the cells, and radiate it to space. The member 13 may conveniently be of aluminium or carbon reinforced with carbon fibres which is sometimes referred to as 'carbon-carbon material' (see for example the opening paragraphs of U.S. Pat. No. 4,476,168) or 'fiber-reinforced graphite'.

During manufacture of the array, the solar cells 4 are secured to the member 13 for example by glueing. The moulded sheet 7 is next secured to the member 13 and the light catcher cone 5 secured in place; in both cases this may be done by glueing. Finally the moulded sheet 8 is secured to the moulded sheet 7 and again this may be done by glueing. The interconnection of the sheets 7 and 8 and the member 13 ensures that the structure of the complete array is extremely rigid with high internal stiffness.

At the interconnections of the 'spiderweb' formed by the arms 12, the sheet 8 is shaped to have similarly shaped recesses 14 and dimples 15. This enables two similar arrays to be folded together front to front for stowage, the dimples 15 of one array fitting into the recesses 14 of the other array.

To improve the packing density of units of the array in an alternative construction, the units in every other row may effectively be shifted along the row by half the pitch between adjacent units and the rows closed together to give a 'hexagonal' arrangement. Four of these 'hexagonal' arrangements are shown in FIGS. 4a, 4b, 4c, and 4d. In each of these arrangements shown the individual solar cell units are indicated at 50, and the rigid arms, corresponding to arms 12 of FIG. 2 are indicated at 51. For the sake of clarity not all of the solar cell units on the arms have been numbered.

Although the constructions of arrays described above have been in the context of use in space, they are equally suitable for terrestrial applications although some modification may be desirable in that case since reduction of mass is not then a prime consideration and alternative ways of dissipating heat from the solar cells 4 may be adopted. For terrestrial use, the solar cells 4 may be silicon cells, the member 13 may be of different material provided with fluid cooling, the sheets 7 and 8 may be replaced by similarly shaped members of injection-moulded thermo-plastic material and a glass cover plate may be provided to give environmental protection to the array.

We claim:

1. A rigid, self-supporting construction for a solar cell array, comprising:
   (a) a first unitary member composed of carbon fiber composite material, said first member having a plurality of paraboloid-shaped portions spaced apart of, and integrally interconnected with, one another, said paraboloid-shaped portions having reflecting surfaces located in the path of incident light and serving as primary reflectors to reflect the incident light;
   (b) a second unitary member composed of carbon fiber composite material and rigidly secured to the first unitary member, said second member having a plurality of hyperboloid-shaped portions spaced apart of, and integrally interconnected with, one another, said hyperboloid-shaped portions being respectively positioned within the paraboloid-shaped portions and having reflecting surfaces located in the path of the light reflected from the primary reflectors and serving as secondary reflectors to redirect the light impinging thereon;
   (c) a generally planar, heat radiator member composed of carbon-carbon material, said radiator member being rigidly secured to the first and second unitary members to form a rigid, self-supporting assembly therewith, said radiator member supporting a plurality of solar cells respectively positioned within the paraboloid-shaped portions in the path of the light redirected by the secondary reflectors to generate electrical energy, said radiator member having a high thermal conductivity for conveying unwanted heat away from the solar cells; and
   (d) a plurality of light catcher cones each mounted between the members for rigidifying the assembly and surrounding respective solar cells to permit off-pointing tolerance.

2. The construction as recited in claim 1, wherein the hyperboloid-shaped portions are interconnected by a framework integral with the second unitary member, said framework including a plurality of arms extending radially from each hyperboloid-shaped portion.

3. The construction as recited in claim 2, wherein each arm has a generally U-shaped cross-section.

4. The construction as recited in claim 2, wherein at least some of the arms intersect at junctions with others of the arms; and wherein the second unitary member includes recesses formed at a first set of junctions and dimples formed at a second set of junctions, each dimple having a complementary contour to that of a respective recess.

5. The construction as recited in claim 4, wherein the first and the second sets of junctions are arranged in linear rows which alternate with one another.

6. The construction as recited in claim 5; and further comprising a second array identical to said first-mentioned array, and wherein the recesses on one array fittingly receive the dimples on the other array for compact storage.

* * * * *